(12) United States Patent
Chen et al.

(10) Patent No.: US 7,039,144 B2
(45) Date of Patent: May 2, 2006

(54) LARGE-INPUT-DELAY VARIATION TOLERANT (LIDVT) RECEIVER ADOPTING FIFO MECHANISM

(75) Inventors: Yi-Hung Chen, Hsinchu (TW); Ming-Shien Lee, Hsinchu (TW); Jew-Yong Kuo, Hsinchu (TW)

(73) Assignee: Silicon Integrated Systems Corporation, Hsinchu (TW)

( * ) Notice: Subject to any disclaimer, the term of this patent is extended or adjusted under 35 U.S.C. 154(b) by 772 days.

(21) Appl. No.: 09/860,518

(22) Filed: May 21, 2001

(65) Prior Publication Data
US 2002/0172311 A1    Nov. 21, 2002

(51) Int. Cl.
*H04L 25/00* (2006.01)
*H04L 7/00* (2006.01)

(52) U.S. Cl. .............. 375/372; 375/373; 375/375; 375/376

(58) Field of Classification Search ............. 375/371, 375/372, 373, 376; 370/516, 517
See application file for complete search history.

(56) References Cited

U.S. PATENT DOCUMENTS

| | | | | |
|---|---|---|---|---|
| 5,272,729 A | * | 12/1993 | Bechade et al. | 375/371 |
| 6,366,529 B1 | * | 4/2002 | Williams et al. | 365/239 |
| 6,711,227 B1 | * | 3/2004 | Kaylani et al. | 375/372 |
| 2001/0055357 A1 | * | 12/2001 | Chen | 375/376 |

* cited by examiner

*Primary Examiner*—Jean Corrielus
*Assistant Examiner*—Qutub Ghulamali
(74) *Attorney, Agent, or Firm*—Donald R. Studebaker; NixonPeabody, LLP

(57) ABSTRACT

The present invention discloses a multiple-stage FIFO mechanism capable of receiving data signals correctly. The circuit includes a write-enable pulse sequencer for sequentially generating a plurality of write-enable signals. An N-stage FIFO sequentially stores an input data and outputs the input data. An output stage selector sequentially generates a control signal. And a multiplexer selectively outputs the input data from the N-stage FIFO.

7 Claims, 6 Drawing Sheets

US 7,039,144 B2

LARGE-INPUT-DELAY VARIATION TOLERANT (LIDVT) RECEIVER ADOPTING FIFO MECHANISM

BACKGROUND OF THE INVENTION

1. Field of Invention

The present invention is related to a synchronous receiver IC and, more particularly, to the synchronous receiver solving the uncertain-arrival-time problem.

2. Background of The Related Art

In high-speed IC, the delay variation among ICs made has become significantly large compared to the period of clock signal in the IC. The large delay variation may result from many factors, such as the manufacture process variation, operating voltage variation, temperature variation, clock-signal skew, clock-signal jitter or input loading variation. It is difficult to maintain the signal arrival time within one clock period of a high frequency synchronous system. So the destination side might wait for multiple clocks to receive data. This situation causes chip function to fail.

Please refer to FIG. 1, which illustrates two subsystems with data delay latency of M clocks and delay variation of m clocks. The source and destination clock tracks for transmitter 102 and receiver 100 are ideally balanced. Then the signal arrival time is determined by the data delay latency and the delay variation. As the data delay latency is 6 ns and the delay variation is 2 ns, then the signal arrival time falls between 4 ns and 8 ns, there is no problem for the receiver 100 to detect input data correctly if the clock period is 10 ns. But when the clock period is 5 ns, an arrival time varying between 4 ns and 8 ns results in sampling the wrong data on the receiver 100. If the receiver 100 is designed to sample the signal in the first clock period, the designer must control the signal arrival time to be within 0 to 5 ns. If the receiver 100 is designed to sample the signal in the second clock, the designer must control the signal arrival time to be within 5 ns to 10 ns. Above is the case that delay variation is smaller than the clock period.

When the delay variation is larger than the clock period, the method mentioned above does not work. So the designer must deal with variation control, which cannot be easily done in a high frequency system. The present invention discloses a multiple-stage FIFO mechanism in a receiver capable of handling large delay variation range and providing an efficient way to detect data with uncertain delay.

SUMMARY OF THE INVENTION

The present invention discloses a circuit including a multiple-stage FIFO mechanism capable of receiving the data correctly. The circuit includes a write-enable pulse sequencer for sequentially generating a plurality of write-enable signals in response to a reset signal. An N-stage FIFO sequentially stores an input data and outputs the input data in response to the plurality of write-enable signals. An output stage selector sequentially generates a control signal, and an N-to-1 multiplexer selectively outputs the data from the N-stage FIFO in response to the control signal. The present invention can be applied to any circuit having uncertain-arrival-time issue.

DETAILED DESCRIPTION OF THE INVENTION

Figure 1:
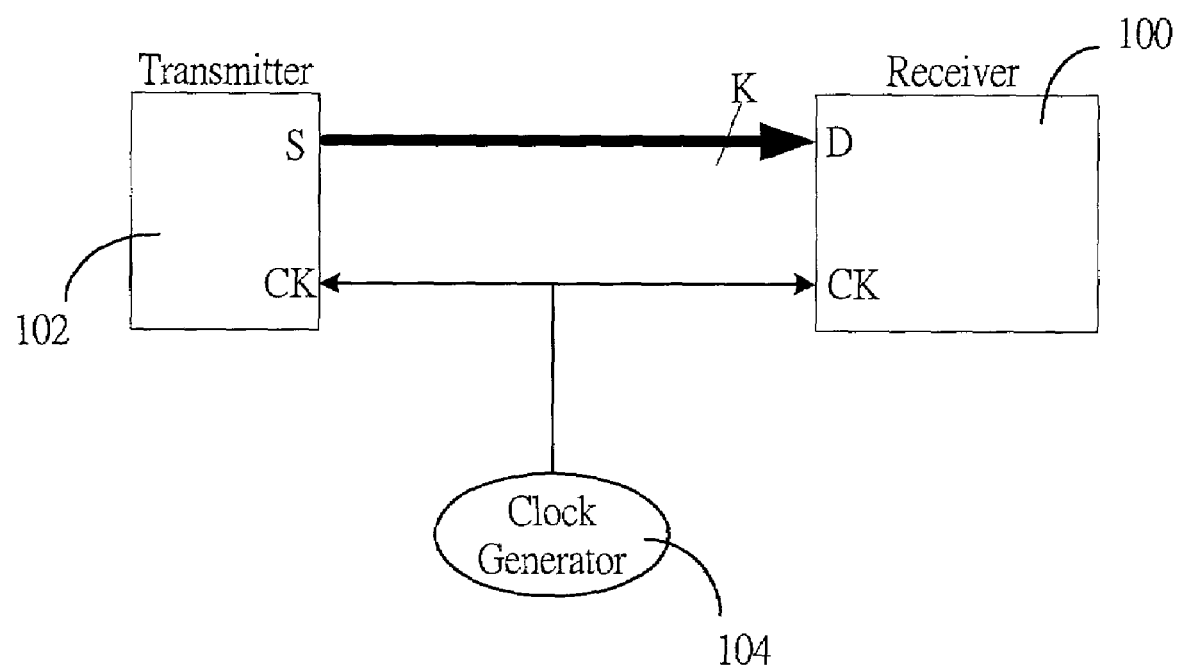
FIG. 1 schematically illustrates two subsystems with data delay latency of M clocks and delay variation of m clocks.

This present invention discloses a circuit for correctly receiving input data with a delay variation. Please refer to FIG. 2, which schematically illustrates an N-stage FIFO implementation. The present invention includes a write-enable pulse sequencer 205, an N-stage FIFO 230, a multiplexer 235, and an output stage selector 240. Preferably, the write enable pulse sequencer 205 includes a modulus-N incremental counter 206 and a decoder 207.

In the following description, the clock signal is denoted as CK, which is used to maintain the synchronicity of the circuit.

The modulus-N incremental counter 206 sequentially generates a count signal 208 having a bus width of $log_2 N$, in response to a reset signal 200 for each time period, such as a clock cycle. In response to the count signal 208, the decoder 207 sequentially asserts a plurality of write enable signals, denoted as 210, 211, 212 . . . respectively. Preferably, the number of write enable signals is equal to N.

Figure 3:
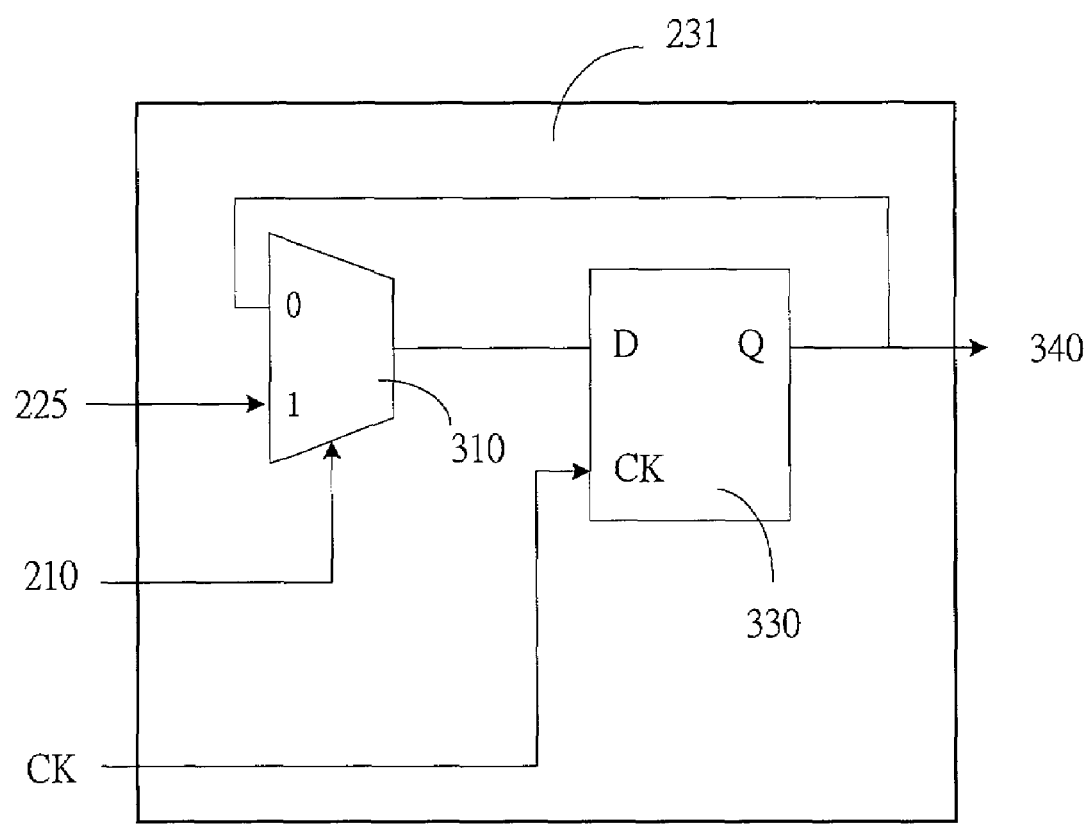
FIG. 3 schematically illustrates the basic bit cell implementation of Stage-0 register 231.

The N-stage FIFO 230 includes N stages of registers, denoted as 231, 232, 233. . . respectively. Preferably, all registers are identical. Please refer to FIG. 3, which illustrates the basic bit cell implementation of Stage-0 register 231. Stage-0 register 231 includes a multiplexer 310 and a D-flip-flop 330.

When a first write enable signal 210 is asserted to the multiplexer 310, the multiplexer 310 samples a first data of the input data appearing at the input line 225 and sends the first data of the input data to the D input terminal of D flip-flop 330. And the D flip-flop 330 in turn outputs at the output line 340 the first data of the input data. If the first write enable signal 210 is disabled, the Q output terminal of D flip-flop 330 outputs the previous data.

Referring back to FIG. 2, when the reset signal 200 is asserted to the write enable pulse sequencer 205, the write enable pulse sequencer 205 is initialized to assert the first write enable signal 210. Each of the write enable signals, 210, 211, etc. is input to one corresponding stage of register. The output line 340 of each stage of register is input to the multiplexer 235. The control signal 236 is used by the multiplexer 235 for selecting one of the inputs appearing at the output line 325. The output data bus has a bus width of K bits. Preferably, the multiplexer 235 is an N-to-1 multiplexer.

In response to the asserted first write enable signal 210, the stage-0 register 231 samples the input data appearing at line 225. In a preferred embodiment, the first valid data byte is sampled into the stage-0 register 231. The input data bus has a bus width of K bits. In response to asserted second write enable signal 211, the stage-1 register 232 samples the input data appearing at line 225 at that moment. For an ideal case, the second valid data byte is sampled into the stage-1 register 232. In succession, the stage-(N−1) register 233 samples an N-th valid data appearing at line 225 at that moment, in response to asserted write enable signal 212.

In one preferred embodiment, each write enable signal 210, 211, 212, etc., is generated in each clock period. Thus, ideally and theoretically, the first valid data of the input data appearing at line 225 in the $0^{th}$ clock of CK enters stage-0 register 231, in response to the first write enable signal 210. The second valid data of the input data appearing at line 225 in the $1^{st}$ clock of CK is sampled into stage-1 register 232, in response to the second write enable signal 211. The N-th valid data of the input data appearing at line 225 in the (N−1)-th clock of CK enters stage(N−1) register 233, in response to the N-th write enable signal 212. From above, it can be easily derived that a (K+1)-th valid data of the input data appearing at line 225 in the K-th clock of CK enters stage-Z register, in response to a (K+1)-th write enable signal, wherein Z=(K mod N). However, when the valid data byte does not appear on line 225 as desired due to data latency and/or delay variation, the corresponding stage of register samples an invalid data byte.

Figure 2:
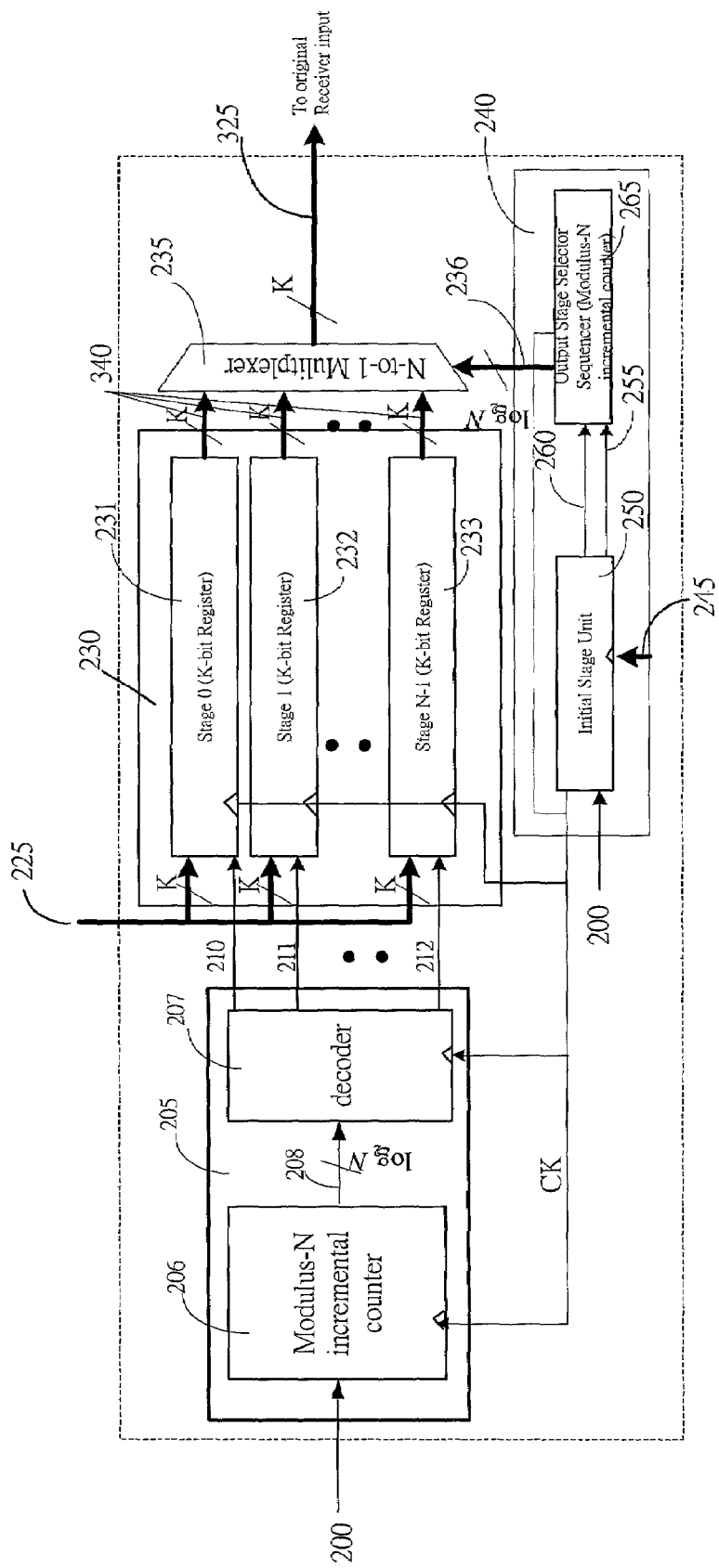
FIG. 2 schematically illustrates the invention with an N-stage FIFO implementation.

The output stage selector 240 preferably includes an initial stage unit 250 and an output stage selector sequencer 265. As shown in FIG. 2, the reset signal 200 is input to the initial stage unit 250, which is also operated in response to CK signal. When the reset signal 200 is asserted, the initial stage unit 250 resets the initial stage number signal 260 by using a prestored initial stage number and, at the same time, outputs a set signal 255. Designer measures the actual delay variation on the die or the chip including the present invention to determine the pre-stored initial stage number needed. The output stage selector sequencer 265 has the initial stage number signal 260 and the set signal 255 as input, other than the CK signal, and outputs a control signal 236. The value on the control signal 236 corresponds to the value appearing on the initial stage number signal 260.

Based on the asserted set signal 255, the output stage selector sequencer 265 begins to generate the control signal 236 which has an initial value equal to the value of the initial stage number signal 260. The output stage selector sequencer 265 preferably includes a Modulus-N incremental counter. As a result, responsive to the CK signal, the control signal 236 increments in succession. The control signal 236 has a bus width of $\log_2 N$.

Preferably, the initial stage unit 250 is further responsive to an optimal latency value 245, which ranges from 0 to N−1. After the circuit has been taped-out and designer obtains the actual value of the delay variation mentioned above, he/she may adjust the initial stage number stored in the initial stage unit 250 using the optimal latency value 245. As the reset signal 200 is asserted, the value of the initial stage number signal 260 takes value of the optimal latency value 245.

In one preferred embodiment of the present invention, the number N is determined by performing the following equations.

$N = \lfloor T\text{inter\_var}/T\text{clock} \rfloor$, if $T\text{inter\_var}$ is an integer multiplier of $T\text{clock}$.

Or, $N = \lfloor (T\text{inter\_var}/T\text{clock})+1 \rfloor$, if $T\text{inter\_var}$ is not an integer multiplier of $T\text{clock}$.

Tinter_var is the delay variation and Tclock is a clock cycle time, and $\lfloor \rfloor$ is a well-known floor operation.

Once N is determined, the number of stage of the N-stage FIFO 230 and the N-to-1 multiplexer 235 are determined.

Figure 4:
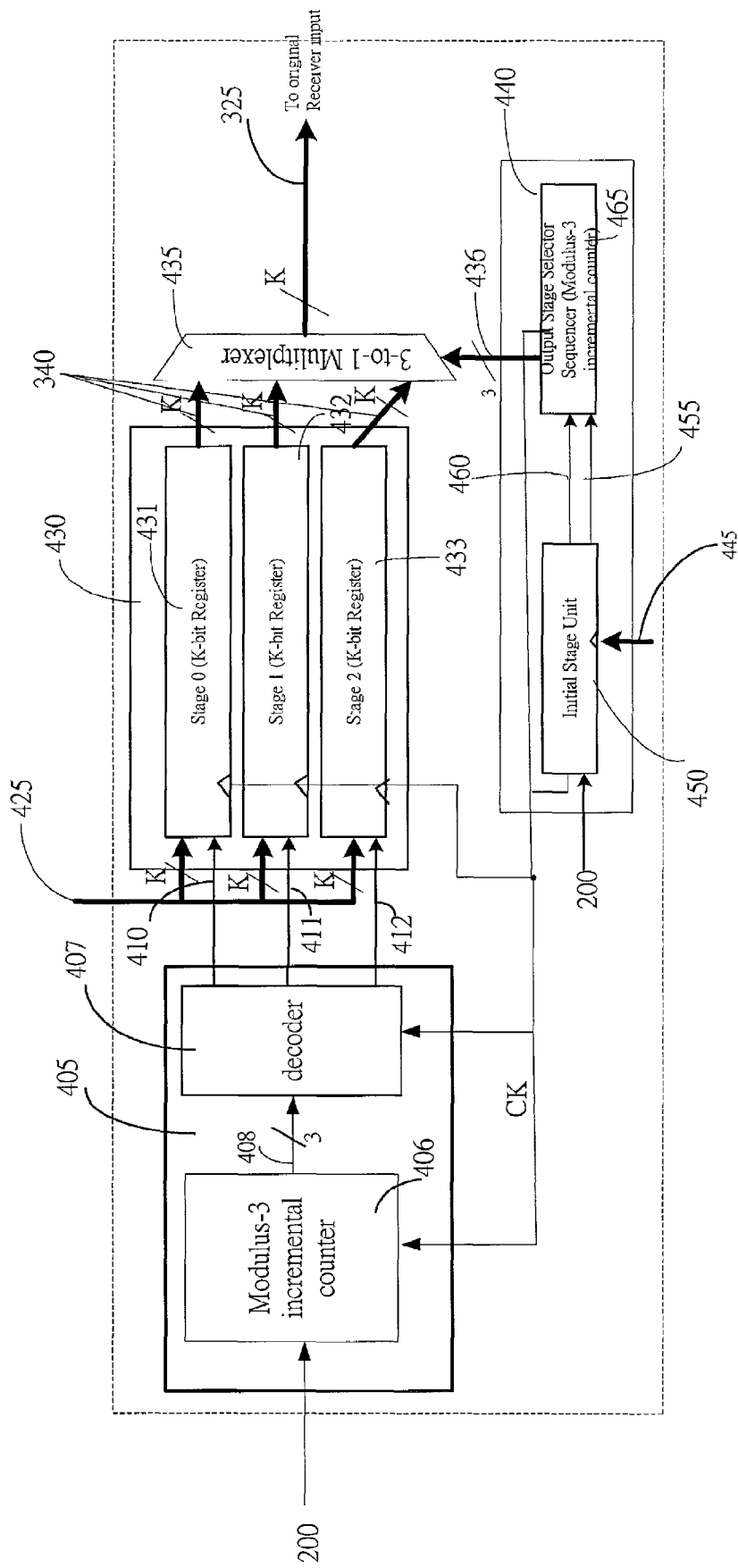
FIG. 4 schematically illustrates the invention with a 3-stage FIFO implementation.

Assuming the delay variation is 3 clocks, we obtain N to be 3. As N is 3, the implementation of the invention is shown in FIG. 4. Since the combinations and operations of circuit shown in FIG. 4 can be easily understood with reference to above descriptions regarding FIG. 2 with N=3, for simplicity purpose, repetitive descriptions of FIG. 4 is considered redundant.

Figure 5A:
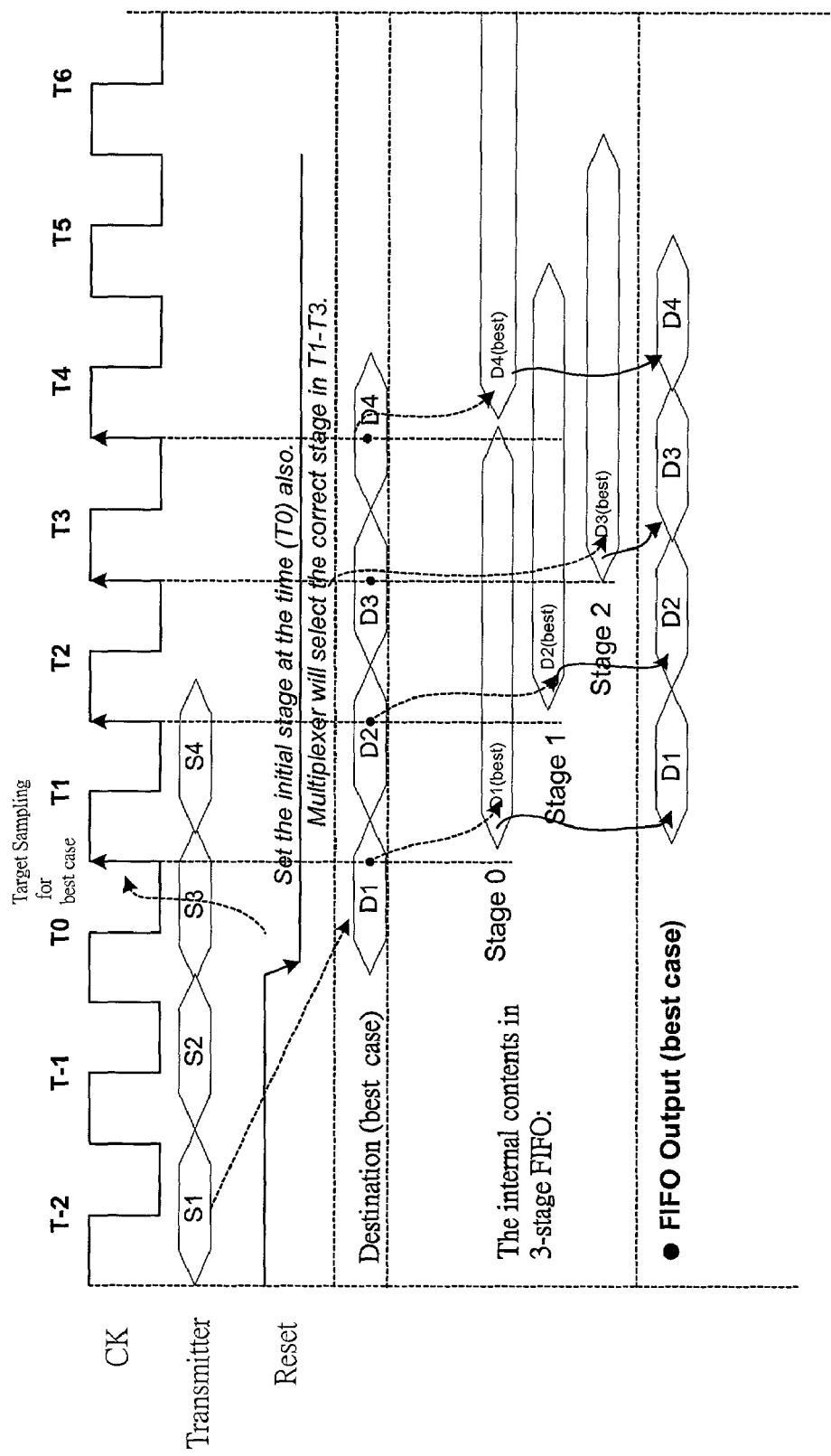
FIG. 5(a) illustrates an exemplified timing of operation of the invention under a best case.
Figure 5B:
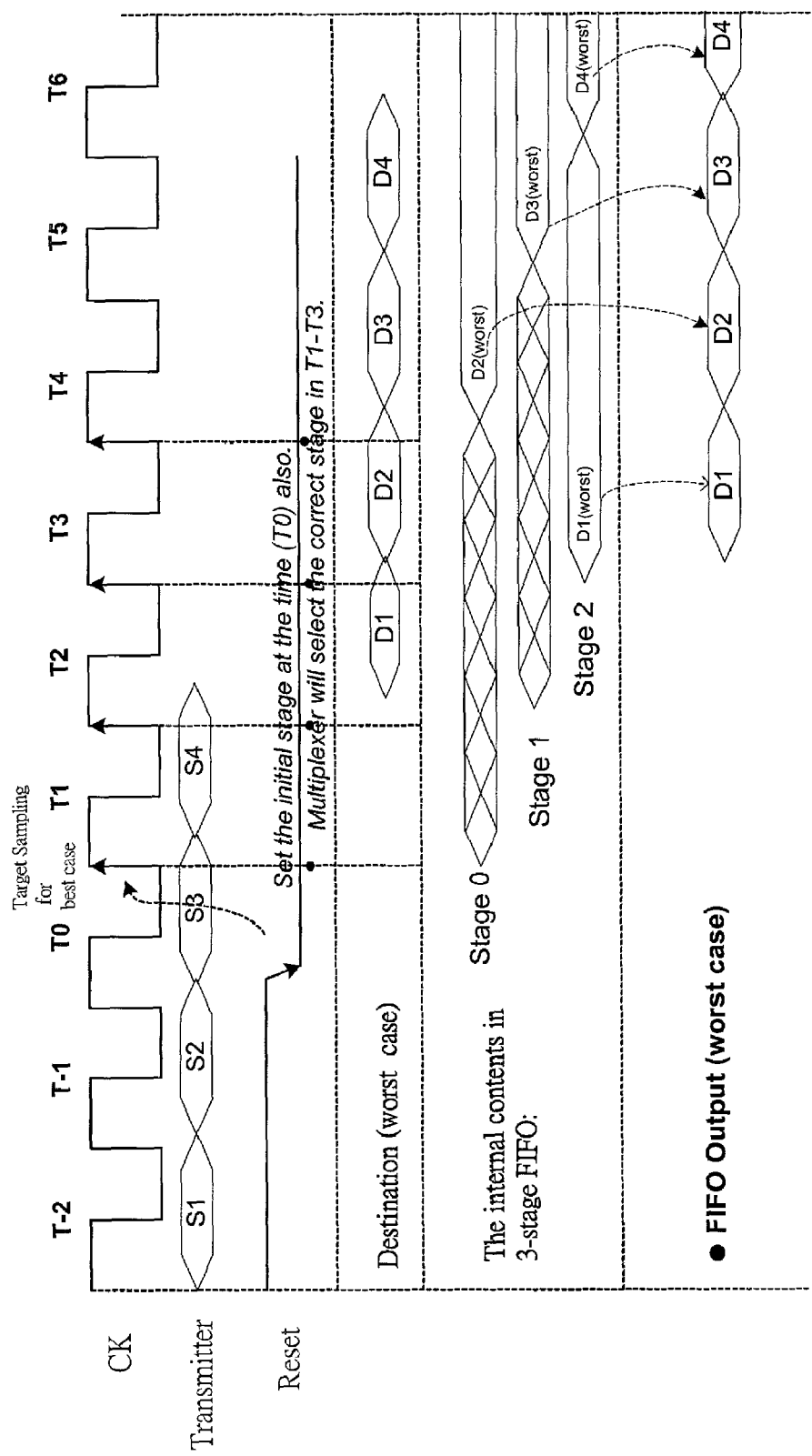
FIG. 5(b) illustrates an exemplified timing of operation of the invention under a worst case.

FIG. 5a to FIG. 5b illustrate an exemplified timing of operation of the invention using a 3-stage FIFO implementation in FIG. 4, wherein one best case and one worst case are shown respectively. In FIGS. 5a and 5b, the transmitter sends out the data bytes S1, S2, S3 and S4 starting from the (T-2) clock. And the arrival time under the best case is indicated by the reset signal 200, which is asserted during T0 clock. Under the best case, the first valid data D1 appears on line 425 between T0 and T1 clocks while under the worst case, the first valid data D1 appears on line 425 between T2 and T3 clocks. It is observed that the data delay latency is 2 clocks and the delay variation is 3 clocks for the worst case.

In FIG. 5a, the first valid data D1 arrives in the T0 clock, which is sampled into Stage-0 register 431. The second valid data D2 arrives in the T1 clock, which is sampled into Stage-1 register 432. It is also observed that the third valid data D3 is sampled into Stage-2 register 433, and the fourth valid data D4 is sampled into Stage-0 register 431 in succession. Therefore, as a chip is detected to be one under the best case, the initial stage number signal 460 is set to be 0. When the reset signal 200 is asserted, the initial stage unit 450 outputs the set signal 455 and the initial stage number signal 460. Responsive to the set signal 455 and the initial stage number signal 460, the control signal 436, having an initial value of 0 due to the initial stage number signal 460 being 0, increments in succession. And the 3-to-1 multiplexer 435 initially selects the output 340 from the Stage-0 register 431 in response to the control signal 436. The first output data appearing on the line 325 is D1. The output data on the line 325 are D2, D3 and D4 afterwards as the control signal 436 increments.

In FIG. 5b, the first valid data D1 arrives in the T2 clock, which is sampled into Stage-2 register 433. Subsequently, the second valid data D2 arrives in the T3 clock, which is sampled into Stage-0 register 431. It is also observed that the third valid data D3 is sampled into Stage-1 register 432, and the fourth valid data D4 is sampled into Stage-2 register 433 in succession. Therefore, as a chip is detected to be one under the worst case, the initial stage number signal is set to be 2. When the reset signal 200 is asserted, the initial stage unit 450 outputs the set signal 455 and the initial stage number signal 460. Responsive to the set signal 455 and the initial stage number signal 460, the control signal 436, having an initial value of 2 due to the initial stage number signal 460 being 2, increments in succession. And the 3-to-1 multiplexer 435 selects the output 340 from the Stage-2 register 433 initially, in response to the control signal 436. The first output data appearing on the line 325 is D1. The output data on the line 325 are D2, D3 and D4 afterwards as the control signal 436 increments.

From above, it is observed that, for each chip, in order to get the output data on line 325 correctly, an initial value of control signal 436 is required. And this required initial value of control signal 436 is resulted using the optimal latency value 445 into the initial stage unit 450. The optimal latency value 445 corresponds to the delay variation value obtained for the chip.

In the foregoing specification the invention has been described with reference to specific exemplar aspects thereof. It will, however, be evident that various modification and changes may be made to thereto without departing from the broader spirit and scope of the invention. The specification and drawings are, accordingly, to be regarded in an illustrative rather than restrictive sense. Thus, it is intended that the present invention covers the modification and variations of this invention provided they come within the scope of the appended claims and their equivalents.

What is claimed is:

1. A circuit for receiving input data with a delay variation, the input data including multiple units of data input to the circuit in a predetermined sequence, comprising:
    a write-enable pulse sequencer, in response to a reset signal and a clock signal, for sequentially generating a plurality of write-enable signals;
    an N-stage register including N stages of register, the N-stage register, in response to the plurality of write-enable signals, for sequentially storing each of multiple units of data within one corresponding stage of register, each of N stages of register having an output terminal outputting one corresponding unit of data;
    an output stage selector for generating a control signal, wherein the output stage comprises:
    an initial stage unit, responsive to the reset signal, for outputting a set signal and an initial stage number signal; and
    an output stage selector sequencer, responsive to the set signal, the clock signal and the initial stage number signal; and
    a multiplexer inputting each one corresponding unit of data from the N-stage register, the multiplexer, responsive to the control signal, for outputting each one corresponding unit of data according to said predetermined sequence.

2. The circuit of claim 1, wherein the write-enable pulse sequencer comprises:
    a modulus-N incremental counter, responsive to the reset signal and the clock signal, for generating a count signal; and
    a decoder, responsive to the count signal, for sequentially generating the plurality of write enable signals.

3. The circuit of claim 1, wherein the unit is a byte.

4. The circuit of claim 1, wherein the output stage selector sequencer comprises a Modulus-N incremental counter.

5. The circuit of claim 1, wherein the initial stage unit is further responsive to an optimal latency value.

6. The circuit of claim 1, wherein N is determined by:

$$N = \lfloor T\text{inter\_var}/T\text{clock} \rfloor \text{ if } T\text{inter\_var is an integer multiplier of } T\text{clock};$$

$$= \lfloor (T\text{inter\_var}/T\text{clock}) + 1 \rfloor \text{ if } T\text{inter\_var is not an integer multiplier of } T\text{clock},$$

wherein Tinter_var is the delay variation and Tclock is a clock cycle time of the clock signal, $\lfloor \rfloor$ is a floor operation.

7. The circuit of claim 1, wherein the multiplexer is an N-to-1 multiplexer.

* * * * *